US012720767B2

(12) United States Patent
Giraud et al.

(10) Patent No.: US 12,720,767 B2
(45) Date of Patent: Aug. 25, 2026

(54) TRANSISTOR CONTROL DEVICE AND CONTROL METHOD

(71) Applicant: COMMISSARIAT A L'ENERGIE ATOMIQUE ET AUX ENERGIES ALTERNATIVES, Paris (FR)

(72) Inventors: Bastien Giraud, Grenoble Cedex (FR); François Andrieu, Grenoble Cedex (FR); Yasser Moursy, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 474 days.

(21) Appl. No.: 18/063,879

(22) Filed: Dec. 9, 2022

(65) Prior Publication Data

US 2023/0413581 A1 Dec. 21, 2023

(30) Foreign Application Priority Data

Dec. 13, 2021 (FR) ..................................... 21 13374

(51) Int. Cl.
*G11C 13/00* (2006.01)
*H03K 17/687* (2006.01)
*H10B 63/00* (2023.01)

(52) U.S. Cl.
CPC ........... *H10B 63/30* (2023.02); *G11C 13/003* (2013.01); *H03K 17/687* (2013.01); *G11C 2213/79* (2013.01)

(58) Field of Classification Search
CPC ............................... H10B 63/30; G11C 13/00
USPC ......................................................... 365/148
See application file for complete search history.

(56) References Cited

U.S. PATENT DOCUMENTS 6,072,217 A * 6/2000 Burr ..................... H10D 86/201 257/351
9,831,272 B2 * 11/2017 Chen .................... H10D 84/907
9,985,029 B2 * 5/2018 Andrieu ............... H10D 84/856
11,417,725 B2 * 8/2022 Carothers ................ H10D 1/00
2007/0063284 A1 * 3/2007 Kawahara ......... H01L 29/78648 257/351

(Continued)

FOREIGN PATENT DOCUMENTS

FR 2 975 828 A1 11/2012
FR 3 003 690 A1 9/2014

OTHER PUBLICATIONS

Aziza, H. et al. Multilevel operation in oxide based resistive RAM with SET voltage modulation, 2016 International Conference on Design and Technology of Integrated Systems in Nanoscale Era (DTIS). IEEE, 2016. p. 1-5. (1 page Abstract).*

(Continued)

*Primary Examiner* — Muna A Techane
(74) *Attorney, Agent, or Firm* — Oblon, McClelland, Maier & Neustadt, L.L.P.

(57) ABSTRACT

An FDSOI transistor control device includes a plurality of first wells having a first type of conductivity, each first well being associated with a group of transistors, and at least one second well having a second type of conductivity, formed under and around the first wells (21). A bias circuit is configured to apply at least one first bias voltage to the first wells and at least one second bias voltage to at least one second well. All of the transistors may have the second type of conductivity.

16 Claims, 5 Drawing Sheets

(56) References Cited

U.S. PATENT DOCUMENTS

| | | | | |
|---|---|---|---|---|
| 2009/0154225 | A1* | 6/2009 | Hidaka | G11C 11/16 365/158 |
| 2013/0062682 | A1* | 3/2013 | Endo | H10B 41/35 257/E21.54 |
| 2014/0077300 | A1* | 3/2014 | Noel | H10D 84/85 257/351 |
| 2019/0385677 | A1 | 12/2019 | Pillarisetty et al. | |

OTHER PUBLICATIONS

Wang, Y et al. "Investigation of resistive switching in Cu-doped HfO, thin film for multilevel non-volatile memory applications", Nanotechnology, 2009, vol. 21, No. 4 . 045202 (1 page abstract).*

French Preliminary Search Report issued Sep. 7, 2022 in French Application 21 13374, filed on Dec. 13, 2021 (with English Translation of Categories of cited documents and Written Opinion), 9 pages.

Wang, Y et al. "Investigation of resistive switching in Cu-doped $HfO_2$ thin film for multilevel non-volatile memory applications", Nanotechnology, 2009, vol. 21, No. 4, p. 045202. (1 page Abstract).

* cited by examiner

[Fig. 6A]
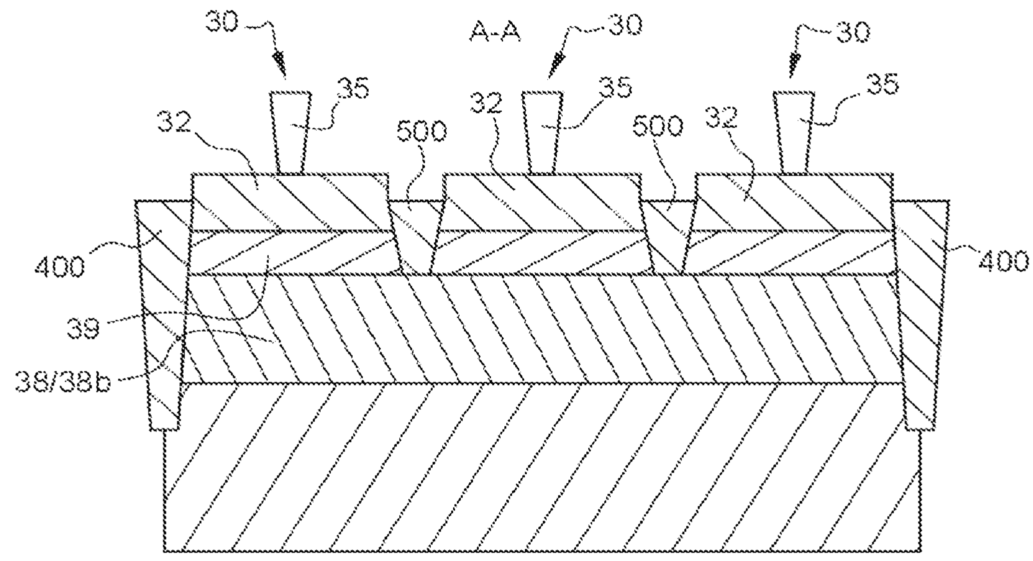
[Fig. 6B]
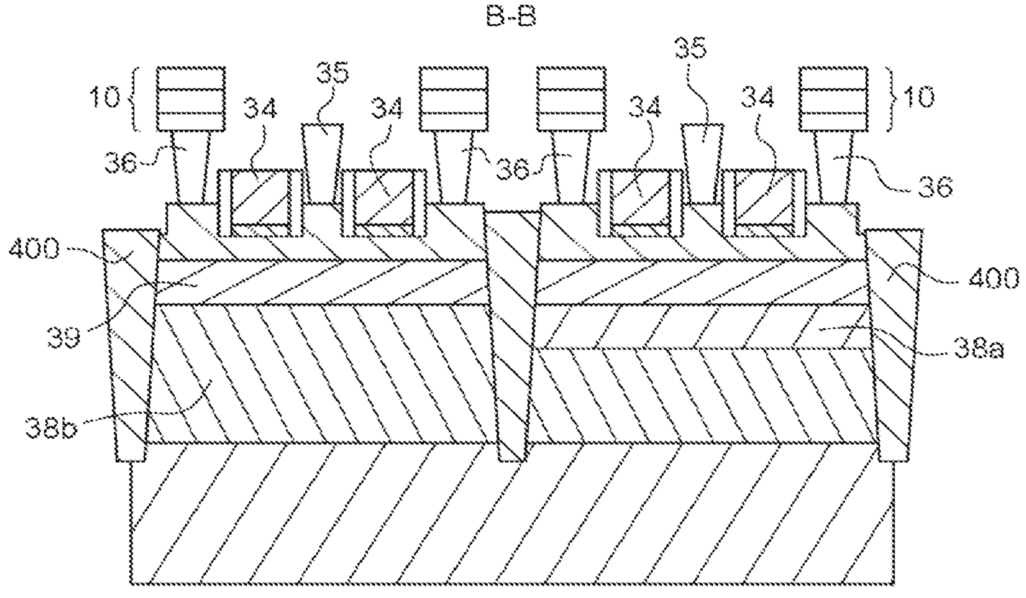

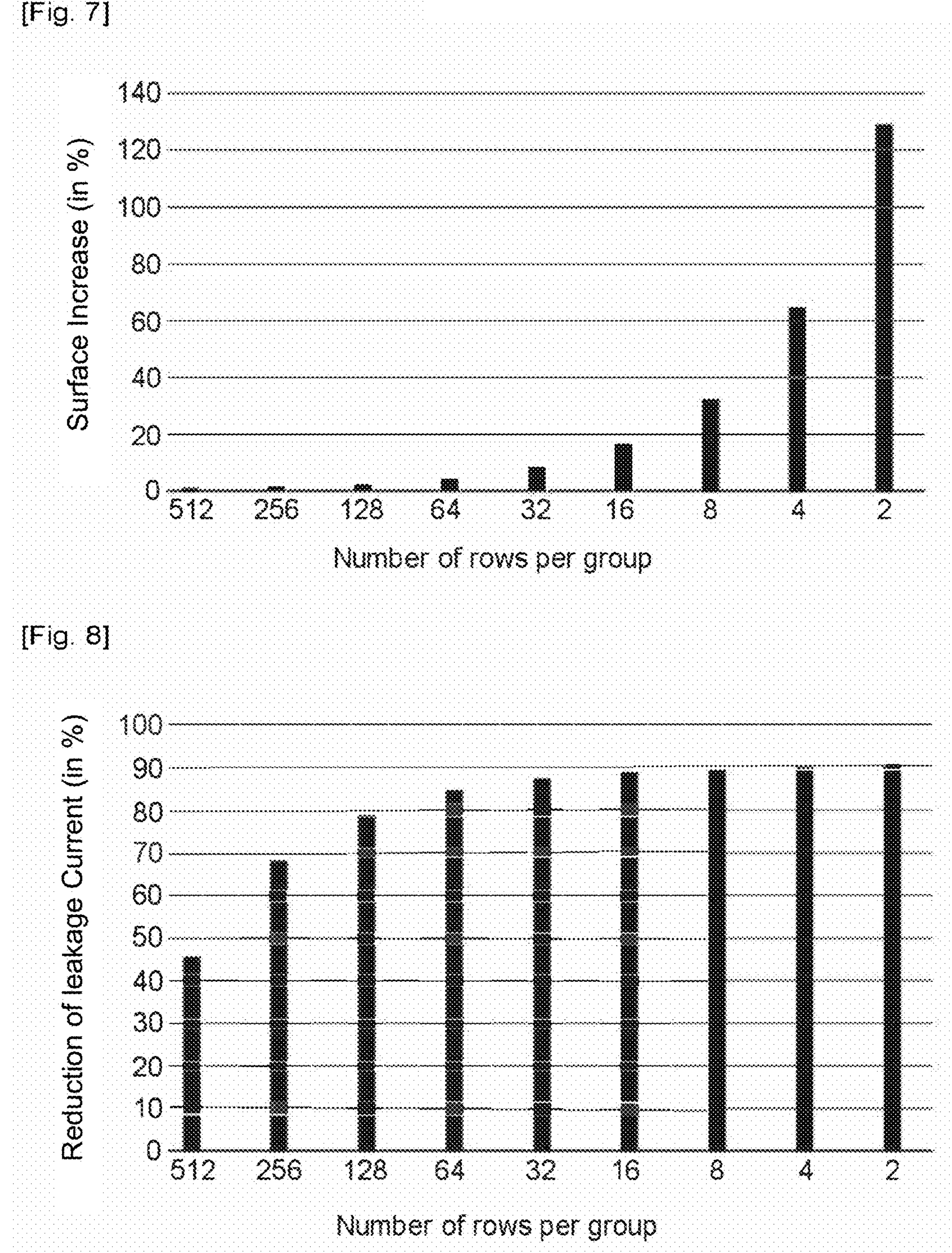
[Fig. 7]
140
120
100
80
60
40
20
0
Surface Increase (in %)
512
256
128
64
32
16
8
4
2
Number of rows per group
[Fig. 8]
100
90
80
70
60
50
40
30
20
10
0
Reduction of leakage Current (in %)
512
256
128
64
32
16
8
4
2
Number of rows per group

TRANSISTOR CONTROL DEVICE AND CONTROL METHOD

TECHNICAL FIELD

The present invention generally relates to a control device comprising a plurality of transistors having one same type of conductivity, and more specifically, transistors of the same type on a totally depleted semiconductor on insulator-type substrate. The present invention also relates to a method for controlling this transistor control device. An advantageous application of this transistor control device relates to RRAM (Resistive Random Access Memories) type circuits.

STATE OF THE ART

Resistive memories, in particular OxRAM (Oxide-Based Random Access Memories) type resistive memories are currently developed for non-volatile applications, with the aim of replacing Flash-type memories. They have, in particular, the advantage of being integrable with the BEOL (Back-End Of Line) method of CMOS (Complementary Metal-Oxide-Semiconductor) technology.

Resistive memories typically comprise a multitude of memory cells arranged in the form of a matrix. In a so-called "1T1R" configuration, each memory cell (also called memory point) comprises a resistive memory element (1R) associated with a selection transistor ("1T").

The resistive memory element can reversibly switch between two resistance states, which correspond to logic values "0" and "1" used to code an information bit.

The information is written in the memory cell by shifting the resistive memory element from a High Resistance State (HRS) to a Low Resistance State (LRS). Conversely, to remove the information from the memory cell, the resistive memory element is shifted from the low resistance state to the high resistance state.

In certain cases, more than two resistance states can be generated, which makes it possible to store several information bits in one same memory cell. Thus, Multi-Level Cells (MLC) are referred to.

The writing and the removal of these multi-level cells MLC can be done by finely controlling, in an analogue manner, the voltage applied to the different connections of the memory cell. These connections are called, in a known manner, "bitline" BL (connection to the resistive element), "sourceline" SL (connection to the source of the selection transistor), "wordline" WL (connection to the gate of the selection transistor). Other known writing and removal solutions consist of making the duration of the so-called SET/RESET passage operations vary (passage from HRS to LRS/passage from LRS to HRS, respectively), typically by adjusting the width of the pulses in voltage applied. This "analogue" management of the writing and of the removal however requires new circuits for generating or regulating analogue voltages and currents and/or a significant modification of the current circuits.

Moreover, the size of a 1T1R memory cell is mainly dictated by the surface area of the substrate occupied by the selection transistor, rather than by the dimensions of the memory element, the latter being located at the level of the metallisation (BEOL). To increase the density of the resistive memories, it is therefore to reduce the surface area occupied by the selection transistor of each memory cell. This reduction is typically done at the expense of the current that the selection transistor is capable of delivering. The programming window of the memory cell is subsequently reduced. A solution consists of applying a bias on the back face of the transistor (technique called BB for "back-biasing"), which makes it possible to dynamically modulate the threshold voltage of the transistor and therefore its capacity to be provided to the current. A forward back-bias (FBB) of the selection transistor generally makes it possible to decrease the threshold voltage and to increase the passing current, for example during a writing operation of the memory cells. A reverse back-bias (RBB) of the selection transistor typically makes it possible to limit current leakages, for example during a reading operation of the memory cells. Different architectures implementing a BB bias have been developed. The document, "Truly Innovative 28 nm FDSOI Technology for Automotive Micro-Controller Applications embedding 16 MB Phase Change Memory, F. Arnaud et al, IEDM18-424 (2018)" describes a memory cell architecture based on complementary transistors on an FDSOI (Fully Depleted Silicon On Insulator)-type substrate. The implementation of the BB bias remains limited and partially ineffective in this type of architecture. The memory cells have, in particular, inhomogeneous performances with this type of architecture. Document FR2975828 A1 discloses another architecture for controlling NMOS and PMOS transistors requiring a ground plane inserted between the active layer and the isolation wells implanted in the substrate. In this type of architecture, the threshold voltage of the transistor remains limited. It is not possible to perform an MLC programming of memory cells via this architecture.

There is therefore a need consisting of increasing the passing current while limiting current leakages, homogenously for all of the memory cells, and thus enabling an MLC programming and/or a reduction in the size of the memory cells.

An aim of the present invention is to meet this need, and to overcome at least partially the disadvantages mentioned above.

Other aims, features and advantages of the present invention will appear upon examining the following description and the accompanying drawings. It is understood that other advantages can be incorporated.

SUMMARY

To achieve this aim, according to a first aspect, a transistor control device is provided, comprising:

- A substrate based on a semiconductive material, having a first type of conductivity.
- An insulating layer based on a dielectric material on said substrate,
- A layer based on a semiconductive material, called active layer, located on the insulating layer,
- A plurality of transistors, each comprising a channel formed in the active layer and configured to be fully depleted,
- A plurality of first wells formed in the substrate and having the first type of conductivity, each first well being associated with and disposed under a group of transistors of the plurality of transistors,
- At least one second well having a second type of conductivity, formed in the substrate under and around the first wells, so as to isolate the first wells from one another and vis-A-vis the substrate,
- A bias circuit configured to apply at least one first bias voltage V1 at the first wells, and at least one second bias voltage V2 at the at least one second well.

Advantageously, all the transistors of the plurality of transistors have the second type of conductivity.

Thus, contrary to the known transistor architecture disclosed in the document, "Truly Innovative 28 nm FDSOI Technology for Automotive Micro-Controller Applications embedding 16 MB Phase Change Memory, F. Arnaud et al, IEDM18-424 (2018)", the device according to the present invention only comprises transistors having one single and same type of conductivity, typically an N-type conductivity. This makes it possible to increase the performances of all of the transistors by applying, for example, one single first bias voltage in "forward back-bias" FBB via the bias circuit. On the contrary, in the known architecture comprising complementary N-type and P-type transistors, by biasing in FBB all of the transistors with one single potential, some will be accelerated and others slowed down, which limits the increase in overall performance. To partially overcome this disadvantage, a solution proposed by the document. "Truly Innovative 28 nm FDSOI Technology for Automotive Micro-Controller Applications embedding 16 MB Phase Change Memory, F. Arnaud et al. IEDM18-424 (2018)" consists of resorting to transistors and wells associated with these transistors having one same type of conductivity, according to an architecture known as "flip well". On the contrary, in the device according to the present invention, the transistors and their associated wells have two different types of conductivity.

The device according to the present invention also makes it possible to limit the current leakages of all of the transistors by applying a first bias voltage in "reverse back-bias" RBB via the bias circuit.

Thus, the device according to the present invention makes it possible to obtain a good homogeneity of the performances of the transistors. It enables an operation of the transistors in FBB or in RBB with one single and same architecture, according to the first bias voltage applied. According to a particular example to control RRAM-type memories, the device makes it possible to use only N-type selection transistors, typically NMOS transistors. The device also makes it possible to apply an FBB or RBB bias, without it being necessary to consider the presence of PMOS transistors as in the prior art.

The use of at least one second voltage-controllable well enables a dynamic isolation of the first wells from one another. The range of possible values for the first BB bias voltage can thus be extended. This ultimately makes it possible to further or more significantly modify the threshold voltages of the transistors. In the case of a decrease in the threshold voltages, the performances of these transistors increase. The size of the transistors can thus be reduced. This also makes it possible to reduce the current leakages of the native BB transistors, i.e. without FBB. The static consumption of the device is thus reduced.

Typically, the variation in potential of the second well does not modify the conductivity of the transistor(s) located on the first well(s). The second well in particular makes it possible to isolate the first wells from one another and vis-à-vis the substrate. The variation in potential of the second well advantageously makes it possible to double the potential range of the first well.

According to another aspect, a method for controlling the transistor control device is provided, comprising:

Applying a first bias voltage V1 to at least one first well of the plurality of first wells, Applying a second bias voltage V2 to the at least one second well surrounding said at least one first well.

Said applications of the first and second voltages V1, V2 are such that there is no electrical conduction between said at least one first and second wells. The second well thus plays the role of electrical isolation between the first wells.

This dynamic isolation of the first wells from one another, controlled via the bias circuit, advantageously makes it possible to extend the range of possible values for the first BB bias voltage. This extended range of values typically makes it possible to consider an MLC programming when the transistors are selection transistors associated with resistive elements and forming 1T1R memory cells with the resistive elements. It is possible to apply different electrical potentials to the first and second wells of the device according to the invention. The bias voltages applied to the first and second wells can vary over time. This dynamic bias of the first and second wells makes it possible to consider an MLC multi-level programming. According to an aspect, the device makes it possible to associate an FDSOI-type circuit and RRAM-type memories. This makes it possible to improve both the programming and the performances of the RRAM-type memories (drop in consumption, access to MIC multi-levels, etc.)

Other aims, features and advantages of the present invention will appear upon examining the following description and the accompanying drawings. It is understood that other advantages can be incorporated. In particular, certain features and certain advantages of the control device can be applied mutatis *mutandis* to the method for controlling this device, and reciprocally.

BRIEF DESCRIPTION OF THE FIGURES

The aims, objectives, as well as the features and advantages of the invention will best emerge from the detailed description of embodiments of the latter, which are illustrated by the following accompanying drawings, wherein.

Figure 1:
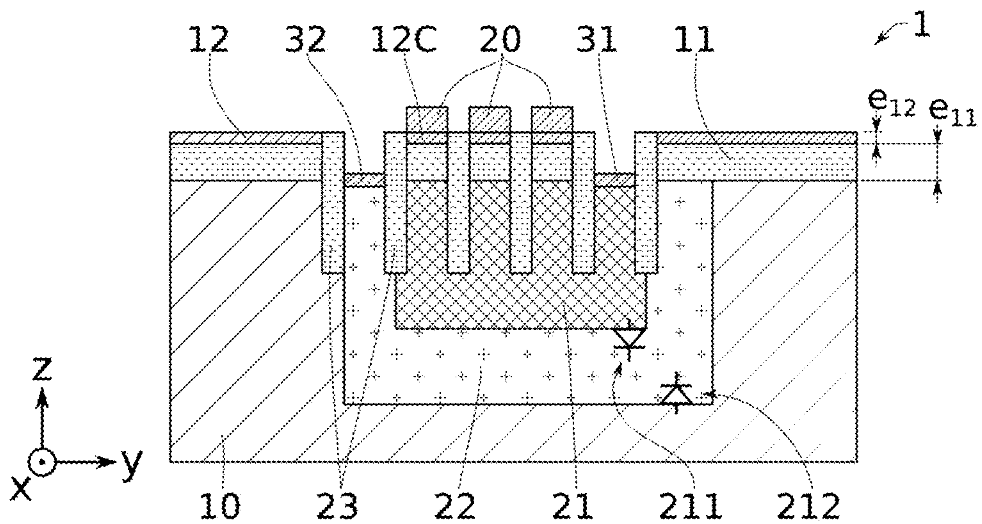
FIG. 1 schematically illustrates, as a transverse cross-section, a transistor control device, according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the thicknesses of the different layers and portions, and the dimensions of the patterns are not representative of reality.

DETAILED DESCRIPTION

Before starting a detailed review of embodiments of the invention, optional features are stated below which can optionally be used in association or alternatively:

According to an example, the at least one second well comprises a plurality of second wells separated from one another by the substrate, each second well being associated with, and disposed under and around a first well of the plurality of first wells.

According to an example, the transistors are separated from one another by trench isolations of one single type, typically shallow trench isolation (STI). This makes it possible to simplify the design of the device, with respect to a device using two types of trench isolations, typically shallow trench isolation STI and deep trench isolation DTI.

According to an example, the transistors are selection transistors, the device further comprising a resistive element associated with each selection transistor and forming a memory cell (1T1R) with said selection transistor.

According to an example, all the transistors of the plurality of transistors are MOS transistors.

According to an example, the second type of conductivity is N-type. The selection transistors are thus preferably NMOS transistors.

According to an example, all the transistors are N-type MOS transistors, and the second bias voltage V2 is of between 0V and 6V.

According to an example, the first bias voltage V1 is of between −6V and +6V.

According to an example, the second bias voltage V2 is greater than or equal to the first bias voltage V1.

According to an example, the first bias voltage V1 is such that $V2-6 \leq V1 \leq V2$.

According to an example, the transistors are selection transistors, the device further comprising a resistive element associated with each selection transistor and forming a memory cell (1T1R) with said selection transistor, the method further comprising:

- Applying a fixed control voltage to at least some of the selection transistors, so as to select certain memory cells associated with said selection transistors, and
- Making the first bias voltage V1 of certain first wells underlying said selected memory cells vary, according to at least three distinct bias values so as to create at least three distinct levels of resistance of the selection transistor for said selected memory cells.

According to an example, the transistors are selection transistors, the device further comprising a resistive element associated with each selection transistor and forming a memory cell (1T1R) with said selection transistor, the method further comprising:

- Fixing the second bias voltage V2 of the at least one second well,
- Making the first bias voltage V1 of certain first wells underlying the selection transistors vary, according to at least three distinct bias values so as to create at least three distinct levels of resistance of the selection transistor for the memory cells associated with said first wells. The bias voltage V2 typically takes a fixed value, for example 0V, 3V, 6V, for a time, typically corresponding to the duration of an elementary programming operation (for example, the coding of a bit). This value can then develop towards another fixed value, for another elementary programming operation, for example.

Unless incompatible, it is understood that all of the optional features above can be combined so as to form an embodiment which is not necessarily illustrated or described. Such an embodiment is obviously not excluded from the invention.

It is specified that, in the scope of the present invention, the terms "on", "surmounts", "covers", "underlying", "vis-à-vis" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a stack, a layer, "based on a material A or A-based", this means a substrate, a stack, a layer comprising this material A only or this material A and optionally other materials, for example alloy elements and/or doping elements. Thus, a silicon-based layer means, for example, an Si, n-doped Si, p-doped Si, SiGe layer.

Several embodiments of the invention implementing successive steps of the control method are described below. Unless explicitly mentioned, the adjective "successive" does not necessarily imply, even if this is generally preferred, that the steps immediately follow one another, intermediate steps being able to separate them.

Moreover, the term "step" means the carrying out of some of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

A preferably orthonormal marker, comprising the axes x, y, z is represented in the accompanying figures. When one single marker is represented in one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under". "underlying". "inserted" refer to positions taken in the direction z.

The terms "vertical", "vertically" refer to a direction along z. The terms "horizontal", "horizontally", "lateral", "laterally" refer to a direction in the plane xy. Unless explicitly mentioned, the thickness, the height and the depth are measured along z.

An element located "in vertical alignment with" or "to the right of" another element means that these two elements are both located on one same line perpendicular to a plane wherein a lower or upper face of a substrate mainly extends, i.e. on one same line oriented vertically in the figures.

In the examples of embodiments below, the control device and the control method are illustrated, in particular, for controlling 1T1R-type memory cells, typically comprising a transistor and a resistive element in series. The invention is not limited to the memory cells. My transistor-based electronic device of one same type can be implemented in the control device and/or the control method according to the present invention.

In the examples of embodiments below, the first well(s) is/are preferably PWells. The second well(s) is/are preferably Deep NWells and/or NWells. The substrate Is preferably P-type (Psub). The transistors are preferably NMOS. It is understood that the types of conductivity can be inverted relative to one another, according to another embodiment of the present invention.

FIG. 1 illustrates an embodiment of the transistor control device.

The transistors 20 are, in this case, typically back-gate FDSOI-type MOS transistors, also called Ultra-Thin Body and BOX (UTBB) transistors. This type of MOS transistor is manufactured from an SOI substrate successively comprising along z, a silicon substrate 10, a so-called buried electrically insulating layer 11, generally an oxide layer (or BOX (buried oxide) layer), and a thin monocrystalline silicon layer 12, also called active layer. The particularity of the FDSOI UTBB transistor is that the BOX layer 11 is extremely thin, typically of thickness $e_{11}$ less than 30 nm, which makes it possible to apply a bias on the back face of the transistor 20. The thickness $e_{12}$ of the thin monocrystalline silicon layer 12 is typically less than 10 nm.

The transistors 20 have a channel 12*c* formed in the active layer 12, under the gate of the transistors 20. This channel 12*c* is configured to operate according to a so-called "fully depleted" mode, in the off state of the transistor. The active layer 12 is typically intentionally non-doped.

The transistors 20 of the device 1 all have the same type of conductivity, preferably an N-type conductivity (the main charge carriers are electrons).

The device 1 also comprises at least one first well 21 having a type of conductivity opposite the type of conductivity of the transistors 20. In this example, the well 21 is P-type. Such a P-type well can be called "PWell" according to usual terminology. This first well 21 typically makes it possible to apply a bias V1 on the back face of the transistor (s) 20. This bias V1 makes it possible to lower or to increase the threshold voltage of the transistors 20, which can thus deliver respectively more or less current, it is generally interesting that the transistor delivers more current in the on state, and less leakage current (in the off state).

The device 1 comprises a bias circuit configured to apply this first bias voltage V1 to the first well 21, by way of a first contact 31.

In order to increase the bias voltage V1 range, the device 1 comprises a second well 22 surrounding the first well 21. The second well 22 typically extends under the first well 21, and laterally borders the first well 21. The second well 22 is configured to electrically isolate the first well 21 vis-à-vis the substrate 10. The second well 22 has a type of conductivity opposite the type of conductivity of the first well 21. In this example, the well 22 is N-type, like the transistors 20. Such an N-type well 22 can comprise a part extending under the first well 21 called "Deep NWell" according to usual terminology, and a part laterally surrounding the first well 21 called "NWell". The Deep NWell part of the well 22 typically makes it possible to ensure a deep isolation of the first well 21, typically vis-à-vis the substrate 10. The NWell part of the well 22 typically makes it possible to ensure a lateral isolation of the first well 21, typically vis-à-vis another first adjacent well 21. The second well 22 is typically formed by an NWell and a Deep NWell. Below, the second well 22 is equally called "NWell" or "Deep NWell", without this necessarily limiting either of the parts of said well.

A first PN diode 211 is thus formed between the first well 21 and the second well 22. A second PN diode 212 is thus formed between the substrate 10 and the second well 22.

Advantageously, a second bias voltage V2 can be applied to this second well 22 by way of a second contact 32 of the bias circuit. This second bias voltage V2 is typically of between 0V and 6V, which makes it possible to preserve the PN diode 212 in the off state. For a silicon-based PN diode 212, the current significantly increases beyond 6V, which makes it possible to preserve the PN diode 212 in the off state. For a silicon-based PN diode 212, the current significantly increases beyond 6V (or below −6V for an inverse biased diode), according to a typically Zener diode feature. The P-type substrate 10 is typically biased at 0V.

The bias voltage V1 range making it possible to preserve the PN diode 211 in the off state is advantageously increased by making the second bias voltage V2 vary. For the diodes 211, 212 substantially of the same nature, the bias voltage V1 range is typically of between −6V and +6V. For example, for V2=0V, the bias voltage V1 can be of between −6V and 0V. This corresponds to an RBB bias of the NMOS transistors 20. For V2=3V, the bias voltage V1 can be of between −3V and +3V. For V2=6V, the bias voltage V1 can be of between 0V and +6V. This corresponds to an FBB bias of the NMOS transistors 20. The bias voltage V1 range making it possible to bias the NMOS transistors 20 on the back face (BB) is thus substantially doubled by adding the Deep NWell 22 controlled in voltage V2.

The controlling of the second well 22 is preferably carried out so as to preserve the off state of the diodes 211, 212. According to a possibility, the bias voltages V1, V2 are applied via the bias circuit, such that V1≤V2.

As illustrated in FIG. 1, the device 1 can also comprise trench isolations 23 on either side of the transistors 20 and of the contacts 31, 32. These trench isolations 23 are preferably shallow trench isolations (STI). Preferably, the device 1 only comprises STIs 23 between the transistors 20 and the contacts 31, 32. In particular, and advantageously, the device 1 does not require resorting to other types of trench isolations, in particular deep trench isolations (DTI) to extend the bias voltage V1 range (BB bias). The trench isolation technology is thus simplified, and the associated cost remains low regarding technologies resorting to two STI and/or DTI depths.

Figure 2:
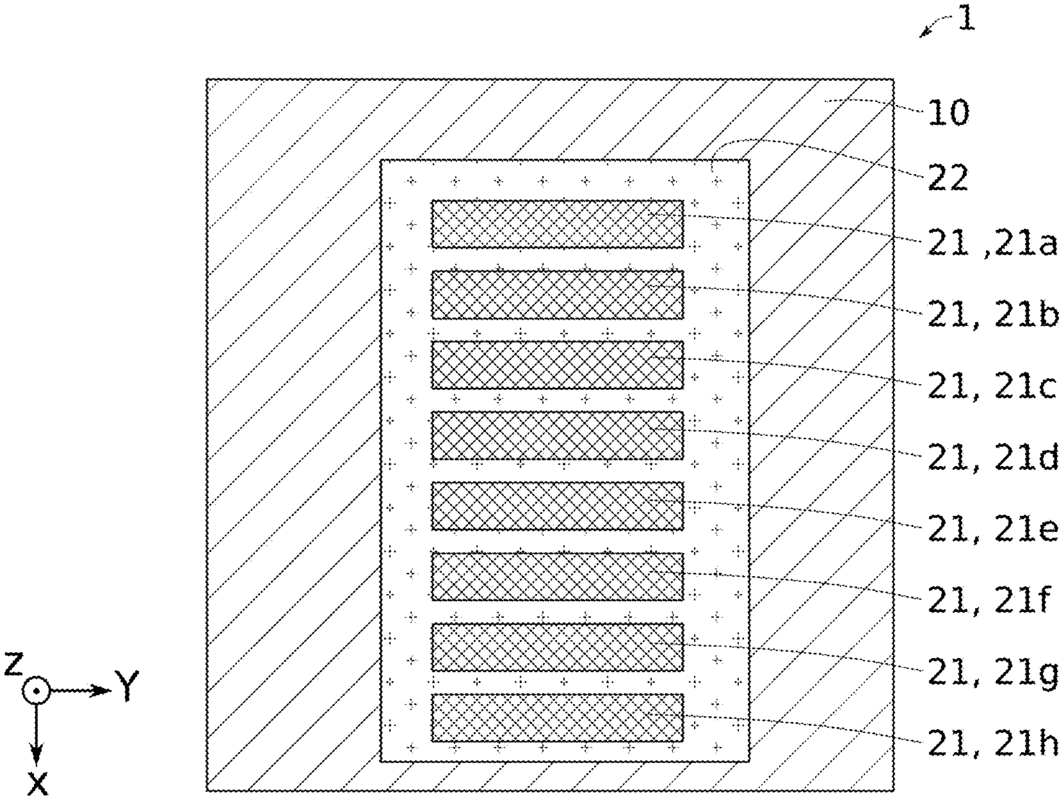
FIG. 2 schematically illustrates, as a top view, a transistor control device, according to an embodiment of the present invention.

FIG. 2 illustrates an embodiment wherein eight first wells 21*a*, 21*b*, 21*c*, 21*d*, 21*e*, 21*f*, 21*g*, 21*h* are isolated from one another by a second well 22. The first wells 21*a*, 21*b*, 21*c*, 21*d*, 21*e*, 21*f*, 21*g*. 21*h* are preferably PWells. The second well 22 is preferably a Deep NWell. The substrate 10 is preferably P-type.

For an RRAM- or OxRAM-type application, each of the eight first wells can comprise a plurality of memory cells arranged in the form of lines. Each first well comprises, for example, 8 lines.

Each first well can be separately biased from the other first wells, via a dedicated bias circuit. Thus, a first well 21, biased so as to apply a forward back-bias FBB to the selection transistors typically corresponds to a memory cell programming operation (writing or removal, SET/RESET). The memory cells formed on this first well are called "selected".

The memory cells formed on a first well 21, biased so as to apply a reverse back-bias RBB to the selection transistors, are typically "non-selected", or selected only when reading.

It is thus possible to program the memory cells of the lines formed on the well 21 a, in FBB configuration over an extended range of values V1, V2, while maintaining the memory cells of the lines formed on the wells 21*b*, 21*c*, 21*d*, 21*e*, 21*f*, 21*g*, 21*h* in RBB configuration over an extended range of values V1, V2.

This makes it possible, for example, to reduce the threshold voltage of the selection transistors (wordline connection) for writing or removal, in FBB configuration. The threshold voltage of the selection transistors (wordline connection) for reading can also be reduced, in RBB configuration. The static consumption of the non-selected lines can also be reduced, in RBB configuration.

The extended ranges of values in RBB (−6V to 0V) and in FBB (0V to +6V) advantageously make it possible to read and write several bits of information within a memory cell, as described in more detail below.

Figure 3:
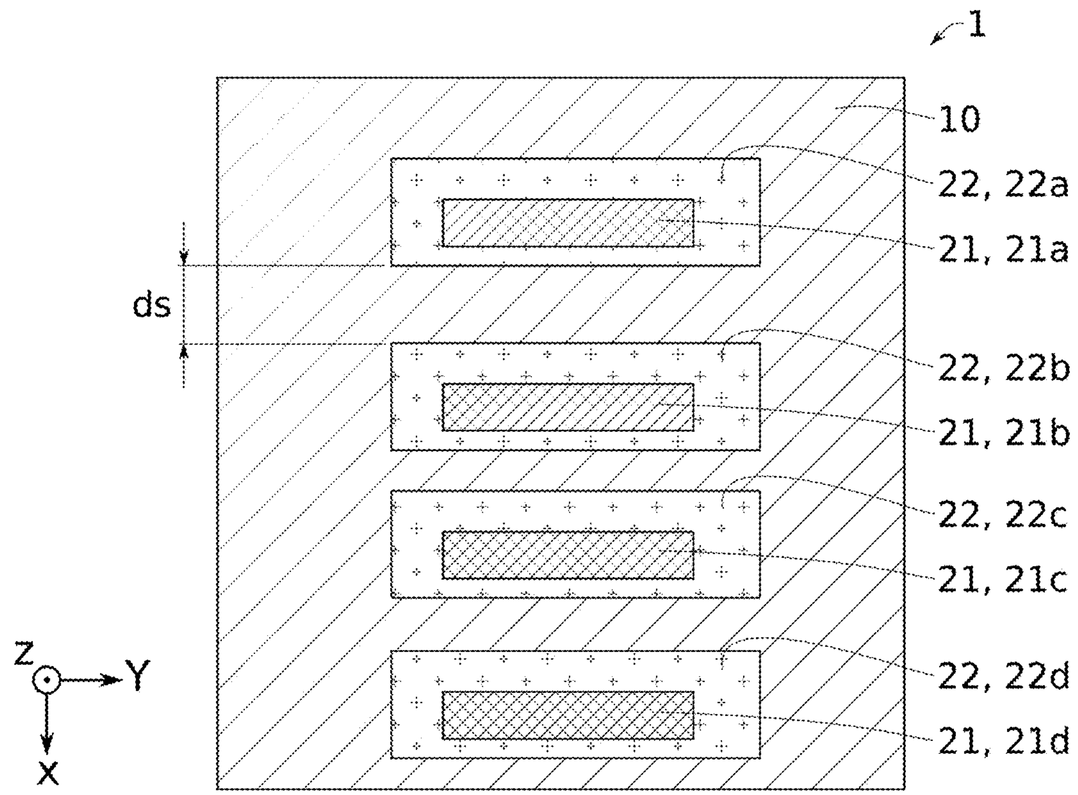
FIG. 3 schematically illustrates, as a top view, a transistor control device, according to another embodiment of the present invention.

FIG. 3 illustrates another embodiment, wherein the first wells 21, 21*a*, 21*b*, 21*c*, 21*d*, are distributed in different second wells 22, 22*a*, 22*b*, 22*c*, 22*d*. In this example, each first well 21 is associated with a second well 22. Other configurations can be considered, for example four first wells 21 distributed within two second wells 22.

The second wells 22*a*, 22*b*, 22*c*, 22*d* are separated and isolated from one another by the substrate 10. The separation distance ds between two second adjacent welts 22*a*, 22*b* is around a few microns, for example, 3 μm. This makes it possible to independently bias the second wells 22. The possibilities of applying different FBB and RBB biases are increased. Thus, for example, the first PWell 21*a* is biased at −6V and the second Deep NWell 22 is biased at 0V. This makes it possible to generate an RBB bias limiting or removing the current leakages. The memory cells associated with the well 21*a* are not selected. The first PWell 21*b* is, for example, biased at +6V and the second Deep NWell 22*b* is biased at +6V. This makes it possible to generate an FBB bias reducing the threshold voltage of the selection transistors, for writing or removal operations, for example. The bias voltages V2 are thus applied independently from one another via the bias circuit. The versatility of the device 1 is increased. The biases V1, V2 of the first and second wells 21, 22 can vary dynamically according to memory accesses, for example. The application of the bias voltages V1, V2 is typically controlled by the bias circuit of the device 1. The number of RBB and/or FBB bias configurations of the different memory cells is thus increased. The extended value ranges in RBB (−6V to 0V) and in FBB (0V to +6V) also make it possible to implement a facilitated MCC programming of the memory cells.

Figure 4:
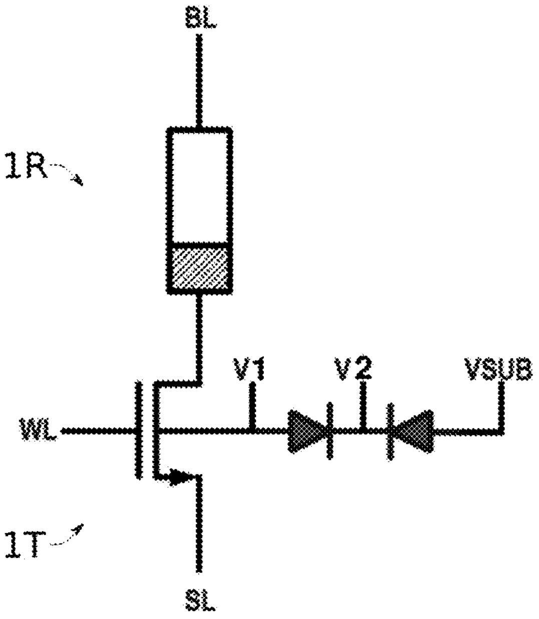
FIG. 4 illustrates an electrical diagram of a memory cell, according to an embodiment of the present invention.

FIG. 4 illustrates an electrical diagram of a memory cell mounted on a first PWell isolated from the substrate by a second Deep NWell, according to a principle of the invention.

Advantageously, the MSC programming of the memory cells can be implemented by controlling the back-bias (BB) by the bias voltage V1, the range of values of which is extended by making V2 vary. In particular, the control of the back-bias BB makes it possible to control the threshold voltage of the transistor and therefore the resistance R between the source and the drain of the transistor (1T) which plays the role of a passing current limiter, in particular in a memory SET operation. If the resistance R of the transistor is reduced, the passing current increases. This makes it possible to reinforce the SET operation.

Figure 5:
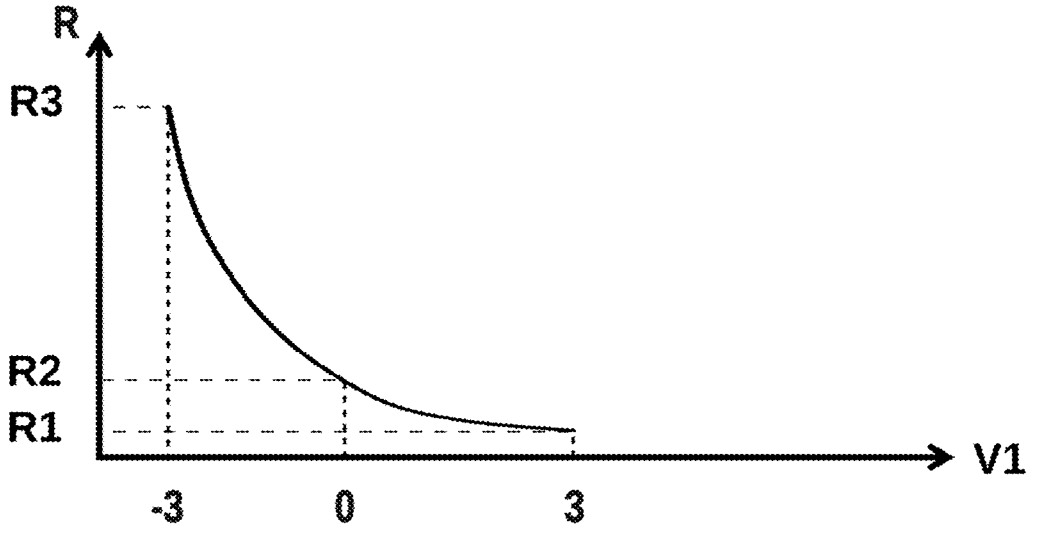
FIG. 5 is a graph illustrating different transistor resistance levels (when it is on) obtained in the scope of an MLC programming, according to an embodiment of the present invention.

As illustrated in FIG. 5, the variation in bias voltage V1 (BB) introduces a variation of the resistance R of the transistor and therefore of the resistive element of the RRAM memory. It is thus possible to access 3 levels or more of RRAM resistance, each coding for distinct bits of information. In the example illustrated, for 3 values of V1 in the range of values between −3V and +3V, V2 being fixed at +3V, 3 levels of resistance R1, R2, R3 are obtained. By extending the range of values of V1, for example between −6V and +6V, the number of levels of resistance permitted increases.

The use of a voltage-controllable double PWell/Deep NWell for FDSOI NMOS transistors advantageously makes it possible to highly modify the threshold voltages of these transistors. The overall energy efficiency is improved. Such a voltage-controllable double well also makes it possible to consider the implementation of MLC for memory cells with the basis of one single and same type of transistor. The surface area occupied by these memory cells, each storing more than one bit of data can thus be significantly reduced.

The invention is not limited to the embodiments described above.

The invention claimed is:

1. A transistor control device comprising:
- a substrate based on a semiconductive material, having a first type of conductivity,
- an insulating layer based on a dielectric material on the substrate,
- an active layer based on the semiconductive material, located on the insulating layer,
- a plurality of transistors each comprising a channel formed in the active layer and configured to be fully depleted,
- a plurality of first wells formed in the substrate and having a first type of conductivity, each first well being associated with and disposed under a group of transistors of the plurality of transistors, the group of transistors being arranged in a first direction and the plurality of wells being arranged in a second direction crossing the first direction,
- at least one second well having a second type of conductivity, each second well being formed in the substrate under and around each of the plurality of first wells, so as to isolate each of the plurality of first wells from one another in the second direction and from the substrate, the at least one second well comprising one or more first wells each having only the first type of conductivity, and
- a bias circuit configured to apply at least one first bias voltage to the plurality of first wells, and at least one second bias voltage to the at least one second well,
- wherein all of the transistors of the plurality of transistors have the second type of conductivity.

2. The device according to claim 1, wherein the at least one second well comprises a plurality of second wells separated from one another by the substrate, each of the plurality of second wells being associated with and disposed under and around a first well of the plurality of first wells.

3. The device according to claim 1, wherein the transistors are separated from one another by trench isolations of one single type.

4. The device according to claim 1, wherein the transistors are selection transistors, the device further comprising a resistive element associated with each selection transistor and forming a memory cell with the selection transistor.

5. The device according to claim 1, wherein the transistors of the plurality of transistors are MOS transistors and wherein the second type of conductivity is N-type.

6. The device according to claim 3, wherein the trench isolations fully pass through the active layer and do not fully pass through the plurality of first wells of the plurality of first wells.

7. The device according to claim 1, wherein the plurality of first wells are directly in contact with the insulating layer and do not comprise conductivity regions different from the first type of conductivity, such that the substrate does not comprise a ground plane within a first well.

8. The device according to claim 1, wherein the first conductivity type is P-type and the second conductivity type is N-type.

9. The device according to claim 1, wherein
- each of the plurality of first wells extends in a first longitudinal direction,
- the first wells are arranged adjacent to each other in a second direction perpendicular to the longitudinal direction, the transistors of the group of transistors associated with each well are arranged in one row in the longitudinal direction, and a portion of the at least one second well is provided between each first well and adjacent first wells in the second direction from a surface of the substrate to a bottom of the first wells.

10. A method for controlling a transistor control device, the transistor control device comprising:

a substrate based on a semiconductive material, having a first type of conductivity, an insulating layer based on a dielectric material on the substrate, an active layer based on the semiconductive material, located on the insulating layer, a plurality of transistors each comprising a channel formed in the active layer and configured to be fully depleted, a plurality of first wells formed in the substrate and having a first type of conductivity, each first well being associated with and disposed under a group of transistors of the plurality of transistors, at least one second well having a second type of conductivity, formed in the substrate under and around the plurality of first wells, so as to isolate the plurality of first wells from one another and vis-à-vis the substrate, the at least one second well comprising one or more first wells each having only the first type of conductivity, and a bias circuit configured to apply at least one first bias voltage to the plurality of first wells, and at least one second bias voltage to the at least one second well, wherein all of the transistors of the plurality of transistors have the second type of conductivity, the method comprising:

at a first time, applying a first bias voltage to at least one first well of the plurality of first wells, and applying a second bias voltage to the at least one second well, the at least one second well surrounding the at least one first well, the applications of the first and second voltages being such that there is no electrical conduction between the at least one first well and the at least one second well, and at a second time, applying a third bias voltage to at least one first well of the plurality of first wells, and applying a fourth bias voltage to the at least one second well surrounding the at least one first well, the third and fourth voltages being different from the first and second voltages.

11. The method according to claim 10, wherein all of the transistors are N-type MOS transistors, and wherein the second bias voltage is between 0V and 6V.

12. The method according to claim 10, wherein the first bias voltage is between −6V and +6V.

13. The method according to claim 10, wherein the second bias voltage is greater than or equal to the first bias voltage.

14. The method according to claim 12, wherein the first bias voltage is given as V1 and the second bias voltage is given as V2, wherein $V2-6 \leq V1 \leq V2$.

15. The method according to claim 12, wherein the transistors are selection transistors, the device further comprising a resistive element associated with each selection transistor and forming a memory cell with the selection transistor, the method further comprising:

applying a fixed control voltage to at least some of the selection transistors, so as to select certain memory cells associated with the selection transistors, and making the first bias voltage of certain first wells underlying the selected memory cells vary, according to at least three distinct bias values so as to create at least three distinct levels of resistance of the selection transistor for the selected memory cells.

16. The method according to claim 12, wherein the transistors are selection transistors, the device further comprising a resistive element associated with each selection transistor and forming a memory cell with the selection transistor, the method further comprising:

fixing the second bias voltage of the at least one second well, and making the first bias voltage of certain first wells underlying the selection transistors vary, according to at least three distinct bias values so as to create at least three distinct levels of resistance of the selection transistor for memory cells associated with the plurality of first wells.

* * * * *